(12) United States Patent
Ong

(10) Patent No.: US 8,315,090 B2
(45) Date of Patent: Nov. 20, 2012

(54) PSEUDO PAGE MODE MEMORY ARCHITECTURE AND METHOD

(75) Inventor: Adrian E. Ong, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 224 days.

(21) Appl. No.: 12/903,152

(22) Filed: Oct. 12, 2010

(65) Prior Publication Data

US 2011/0299330 A1  Dec. 8, 2011

Related U.S. Application Data

(60) Provisional application No. 61/363,576, filed on Jul. 12, 2010, provisional application No. 61/352,306, filed on Jun. 7, 2010.

(51) Int. Cl.
*G11C 11/14* (2006.01)
(52) U.S. Cl. ............... 365/171; 365/63; 365/158
(58) Field of Classification Search ............ 365/171, 365/173, 148, 158, 63
See application file for complete search history.

(56) References Cited

U.S. PATENT DOCUMENTS

| | | | |
|---|---|---|---|
| 6,421,293 B1 | 7/2002 | Candelier et al. | |
| 6,552,928 B1 | 4/2003 | Qi et al. | |
| 6,590,825 B2 | 7/2003 | Tran et al. | |
| 6,842,361 B2 | 1/2005 | Miyatke et al. | |
| 7,164,599 B2 * | 1/2007 | Hosotani et al. | 365/158 |
| 7,206,220 B2 * | 4/2007 | Ditewig et al. | 365/158 |
| 7,394,685 B2 | 7/2008 | Ooishi et al. | |
| 7,742,329 B2 | 6/2010 | Yoon et al. | |
| 7,936,592 B2 | 5/2011 | Wang et al. | |
| 8,077,501 B2 * | 12/2011 | Ong | 365/158 |
| 8,077,508 B1 * | 12/2011 | Ong | 365/171 |
| 2008/0189588 A1 | 8/2008 | Tanaka et al. | |
| 2008/0215954 A1 | 9/2008 | Oshikiri | |
| 2012/0020159 A1 * | 1/2012 | Ong | 365/185.08 |

OTHER PUBLICATIONS

Notice of Allowance for U.S. Appl. No. 12/558,451 mailed on Aug. 11, 2011.
Notice of Allowance for U.S. Appl. No. 12/544,189, mailed on Aug. 24, 2011.

* cited by examiner

*Primary Examiner* — Gene Auduong
(74) *Attorney, Agent, or Firm* — Renaissance IP Law Group LLP

(57) ABSTRACT

A non-volatile memory array includes a plurality of word-lines and a plurality of columns. One of the columns further includes a bistable regenerative circuit coupled to a first, a second, a third, and a fourth signal lines. The column also includes a non-volatile memory cell having current carrying terminals coupled to the first and second signal lines and a control terminal coupled to one of the plurality of word-lines. The column further includes a first transistor and a second transistor. The first transistor is coupled to the first terminal of the bistable regenerative circuit, and to a fifth signal line. The second transistor has a first current carrying terminal coupled to the second terminal of the bistable regenerative circuit, and a second current carrying terminal coupled to a sixth signal line. The gate terminals of the first and second transistors are coupled to a seventh signal line.

25 Claims, 13 Drawing Sheets

PSEUDO PAGE MODE MEMORY ARCHITECTURE AND METHOD

CROSS-REFERENCES TO RELATED APPLICATIONS

This application is related to commonly assigned application Ser. No. 61/363,576, filed Jul. 12, 2010, entitled "NON-VOLATILE STATIC RAM CELL CIRCUIT AND TIMING METHOD"; commonly assigned application Ser. No. 61/352,306, filed Jun. 7, 2010, entitled "MULTI-SUPPLY SYMMETRIC DRIVER CIRCUIT AND TIMING METHOD"; commonly assigned application Ser. No. 12/558,451, filed Sep. 11, 2009, entitled "DIFFERENTIAL READ AND WRITE ARCHITECTURE"; and commonly assigned application Ser. No. 12/544,189, filed Aug. 19, 2009, entitled "DYNAMIC MULTISTATE MEMORY WRITE DRIVER," the contents of all of which are incorporated herein by reference in their entirety.

BACKGROUND OF THE INVENTION

The present invention relates to memory integrated circuits, and more particularly to a non-volatile static random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash Erasable Programmable Read Only Memory (Flash EPROM) or a magnetic random access memory (MRAM), retains its charge even after the power applied thereto is turned off. Therefore, where loss of data due to power failure or termination is unacceptable, a non-volatile memory is used to store the data.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver circuit adapted to deliver sufficient current to write a "0", may not be able to provide enough current to write a "1". Similarly, a write driver circuit adapted to deliver sufficient current to write a "1" may deliver a current that is greater than what would otherwise be an acceptable current level to write a "0".

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$ or $R_P$ state Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

As described above, the voltage required to switch an MTJ from an AP state to a P state, or vice versa, must exceed a critical value Vc. The current corresponding to this voltage is referred to as the critical current Ic. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$ when it is in P state and receives no or very small voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{CC}$ is assumed to be 1.8 volts. Signal WL, as well as signal CS which is a column select signal, are shown as having been boosted to a higher Vpp programming voltage of 3.0 volts. During the write "0" operation, the voltages at nodes BL, SL and SN are shown as being approximately equal to 1.43 V, 0.34 V, and 0.88 V respectively. During the write "1" operation, the voltages at nodes BL, SL and SN are shown as being approximately equal to 0.23 V, 1.43 V, and 0.84 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current $I_c$ greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to ($V_{WL}-V_{SN}$), and the drain-to-source voltage of transistor 20 is set to ($V_{SL}-V_{SN}$).

BRIEF SUMMARY OF THE INVENTION

Conventional memory devices, although widely used, suffer from various limitations. For example, DRAM offers a cost benefit and SRAM offers a speed advantage, but both DRAM and SRAM are volatile memories and can not retain data without a power supply. On the other hand, conventional non-volatile memories, such as flash, suffer from slow programming time and higher testing cost. In accordance with some embodiments of the present invention, MRAM memories, such as STT-RAM memories, can provide the cost benefit of DRAM, the fast read and write performance of SRAM, and the non-volatility of flash memory. In some embodiments of the invention, MRAM can be used to replace embedded SRAM, flash, and DRAM.

In accordance with embodiments of the present invention, a memory array architecture and associated methods are provided. In some embodiments, the memory cells of a non-volatile memory array are arranged in columns. In a specific example, the memory cell includes a magnetic tunnel junction coupled in series with a transistor. Each memory cell in a column has two current-carrying terminals coupled to two common data lines and a control terminal coupled to a word line. The column also includes a bistable regenerative circuit having its I/O terminals coupled to the two data lines. The power and ground terminals of the bistable regenerative circuit are coupled to two control signal lines. When activated, the bistable regenerative circuit can be used to hold data to be written to the memory cell or data read from the memory cell. Depending on the application, bistable regenerative circuit in the column can be used, for example, for implementing page mode or burst mode memory operations. Merely as examples, some embodiments have been applied to emulate double data rate (DDR) DRAM operations. But it would be recognized that embodiments of the invention have a much broader range of application.

In a specific embodiment, a non-volatile memory array includes a plurality of word-lines and a plurality of columns. At least one of the columns further includes a bistable regenerative circuit that has a first terminal coupled to a first signal line, a second terminal coupled to a second signal line, a third terminal coupled to a third signal line, and a fourth terminal coupled to a fourth signal line. The column also includes a non-volatile memory cell having a first current carrying terminal coupled to the first signal line, a second current carrying terminal coupled to the second signal line and a control terminal coupled to one of the plurality of word-lines. The column further includes a first transistor and a second transistor. The first transistor has a first current carrying terminal coupled to the first terminal of said bistable regenerative circuit, and a second current carrying terminal coupled to a fifth signal line. The second transistor has a first current carrying terminal coupled to the second terminal of the bistable regenerative circuit, and a second current carrying terminal coupled to a sixth signal line. The gate terminals of the first and second transistors are coupled to a seventh signal line.

In accordance with alternative embodiments of the present invention, a method of forming a non-volatile memory array and methods of operating the non-volatile memory array are also provided.

A further understanding of the nature and advantages of the present invention may be realized by reference to the remaining portions of the specification and the drawings.

DETAILED DESCRIPTION OF THE INVENTION

Figure 1A:
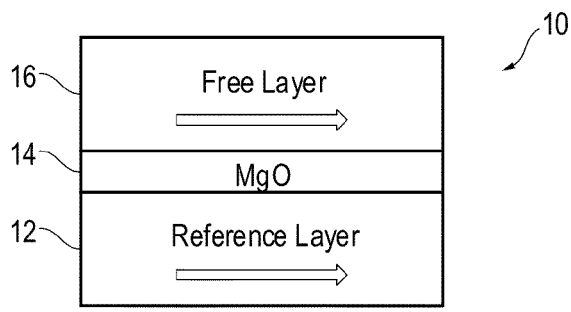
FIG. 1A is a simplified cross-sectional view of a magnetic tunnel junction structure of a magnetic random access memory cell when placed in a parallel magnetization state, as known in the prior art.
Figure 1B:
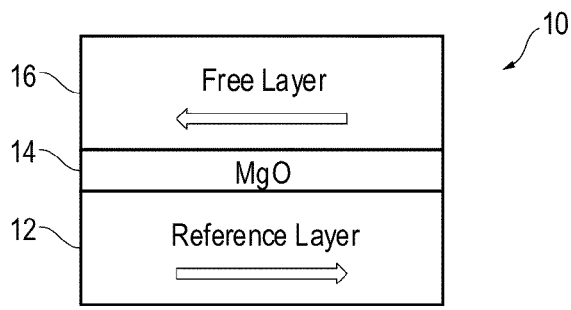
FIG. 1B shows the magnetic tunnel junction structure of FIG. 1A when placed in an anti-parallel magnetization state, as known in the prior art.
Figure 1C:
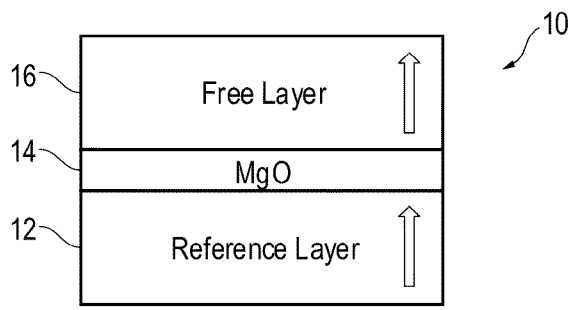
FIG. 1C is a simplified cross-sectional view of a magnetic tunnel junction structure of a magnetic random access memory (MRAM) cell when placed in a parallel magnetization state, as known in the prior art.
Figure 1D:
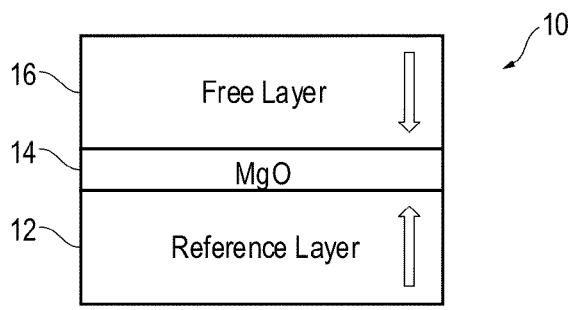
FIG. 1D shows the magnetic tunnel junction structure of FIG. 1D when placed in an anti-parallel magnetization state, as known in the prior art.
Figure 2A:
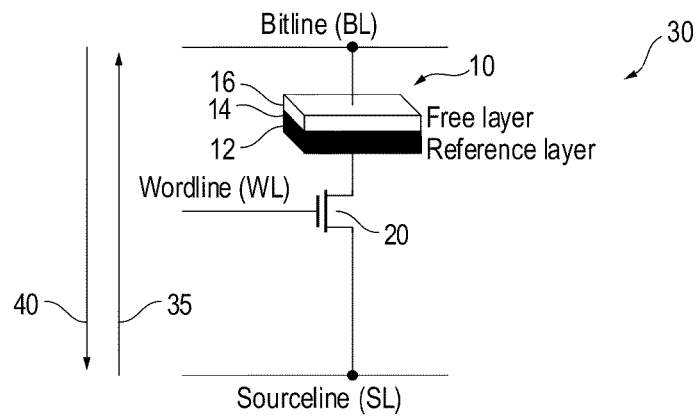
FIG. 2A shows a number of layers of a magnetic tunnel junction structure coupled to an associated select transistor, as known in the prior art.
Figure 2B:
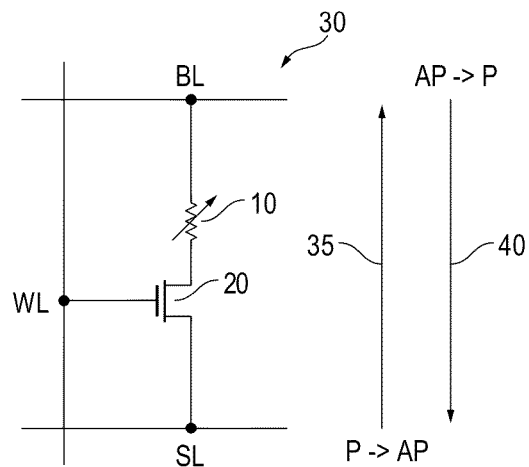
FIG. 2B is a schematic representation of the magnetic tunnel junction structure and its associated select transistor of FIG. 2A, as known in the prior art.
Figure 3:
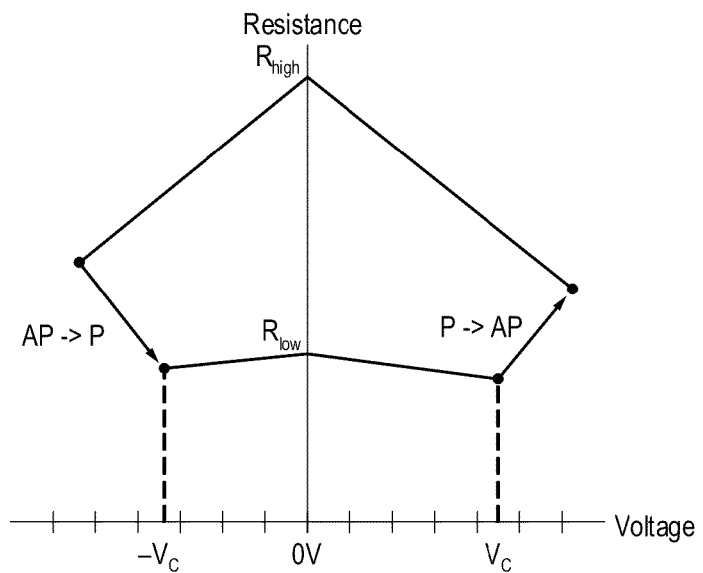
FIG. 3 shows the variation in the resistance of the magnetic tunnel junction structure of FIG. 2A in response to applied voltages, as known in the prior art.
Figure 4A:
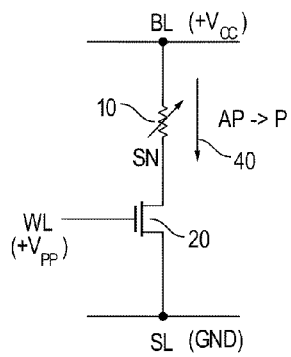
FIG. 4A shows a magnetic tunnel junction structure being programmed to switch from an anti-parallel state to a parallel state, as known in the prior art.
Figure 4B:
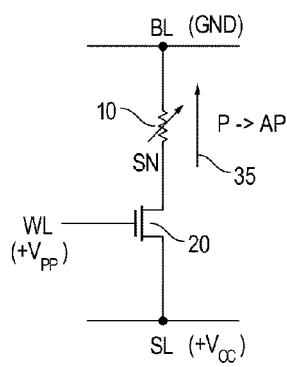
FIG. 4B shows a magnetic tunnel junction structure being programmed to switch from a parallel state to an anti-parallel state, as known in the prior art.
Figure 5:
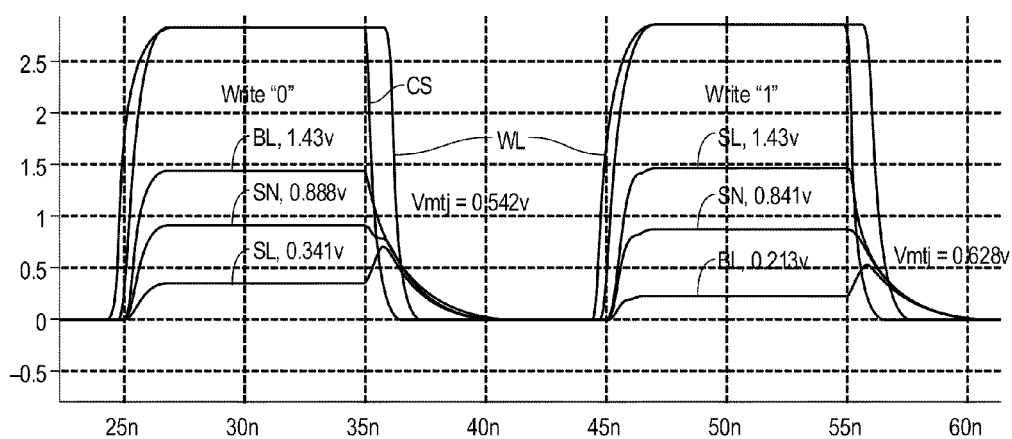
FIG. 5 is an exemplary timing diagram of a number of signals associated with a magnetic random access memory during write "0" and write "1" operations, as known in the prior art.
Figure 6:
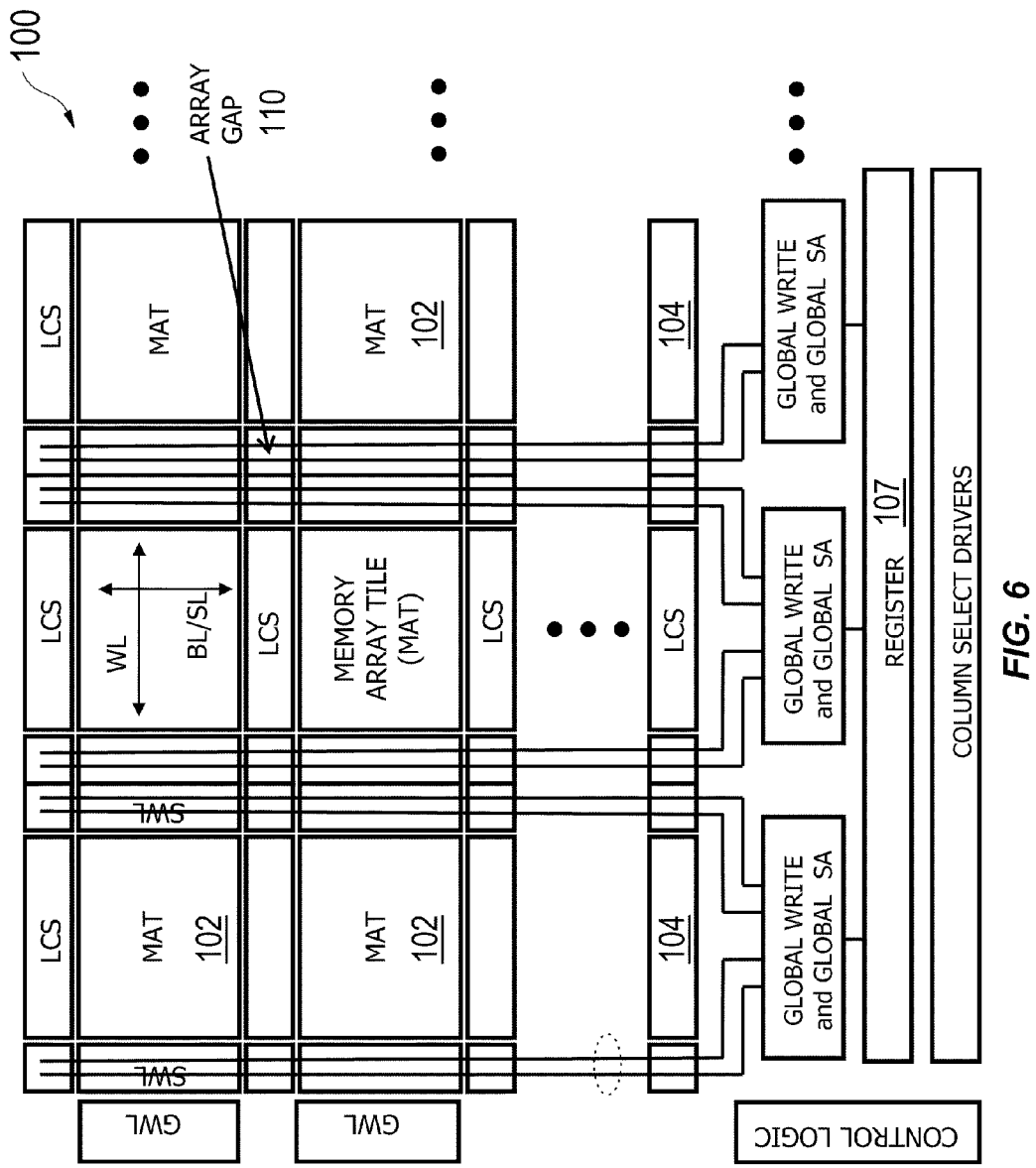
FIG. 6 is a block diagram of an MRAM and associated writing and reading circuitry, in accordance with one embodiment of the present invention.

FIG. 6 is a block diagram of an MRAM array and associated writing and reading circuitry 100, hereinafter alternatively referred to as MRAM 100, in accordance with one embodiment of the present invention. MRAM 100 includes a multitude of array blocks selected by column select drivers, a multitude of global write, a multitude of global sense amp (SA), a multitude of global word line (GWL) circuits, and a control circuit. Each block may include an array of MRAM cells (memory array tile, or MAT) 102 whose rows are selected by one or more sub word line (SWL) circuits, and whose columns are selected by one or more local column select circuits (LCS) 104. The corners of each block include an array gap area 110 to be described in further detail below. In some embodiments, MRAM 100 also includes a register block 107 for reading and/or writing operations.

Figure 7:
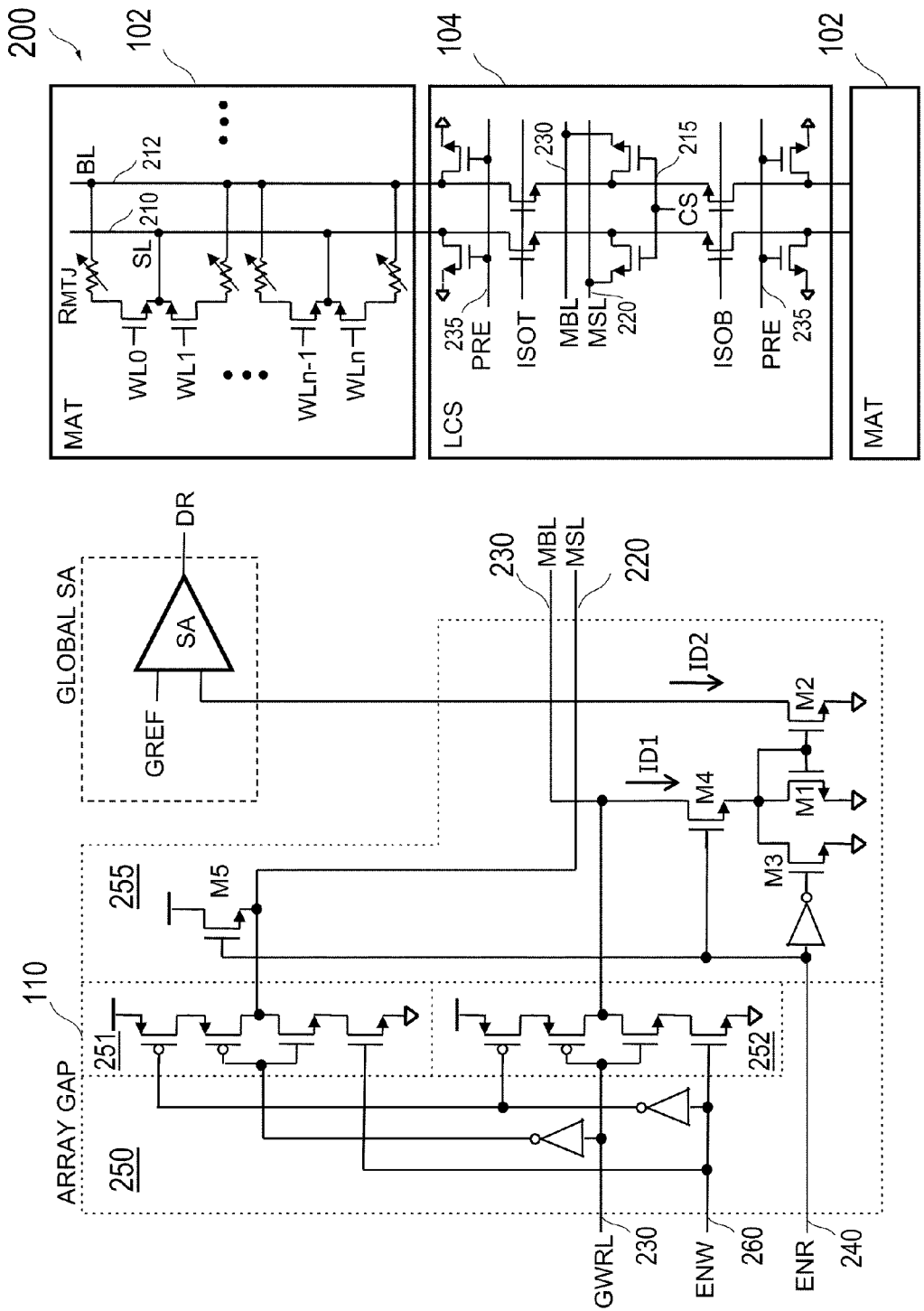
FIG. 7 is a schematic diagram of portions of an MRAM showing associated writing and reading circuitry, in accordance with one embodiment of the present invention.

FIG. 7 is a schematic diagram 200 of portions of MRAM 100, in accordance with one embodiment of the present invention. Schematic diagram 200 is shown as including MAT 102, LCS 104, array gap 110, and a global SA.

MAT 102 includes a number of MRAM cells whose select transistors are coupled to word lines WL0-WLn driven by the sub word line (SWL) circuits and the global word line (GWL) circuits described above in connection with FIG. 6. The MRAM cells are also coupled to a source line (SL) 210 and a bit line (BL) 212 pair. The MAT includes a multitude of SL and BL pairs selectable by LCS 104. The LCS includes pairs of n-channel select transistors which couple a selected SL and BL pair in MAT 102 to a pair of MSL 220 and MBL 230 lines under control of a column select (CS) 215, a precharge (PRE) 235, an isolation top (ISOT), and an isolation bottom (ISOB) signal. The LCS determines whether to couple adjacent MAT 102 above or below the LCS by enabling one of the respective ISOT or ISOB signals. In the example shown in FIG. 7, the top MAT is selected by enabling ISOT and disabling ISOB. One of the multitude of SL and BL pairs is selected by the CS signal driven by the column select drivers, to couple the selected SL and BL pair to the respective MSL and MBL lines. The SL/BL and respective MSL/MBL lines are ready for write or read operation modes when PRE is disabled. MSL 220 and MBL 230 are coupled from LCS 104 to array gap 110.

Array gap 110 includes a local write circuit 250 and a local read circuit 255. As shown, local write circuit 250 is coupled to an enable write signal (ENW) 260 and a global write line (GWRL) 280. In this embodiment, local write circuit 250 includes two write driver circuit 251 and 252, each of which includes two PMOS transistors and two NMOS transistors connected in series. ENW 260 and GWRL 280 and their complementary signals are coupled to write drivers 251 and 252. During a write mode operation, local write circuit 250 drives the MSL and MBL lines (and the respective SL and BL line pair) under control of a number of enable write lines including such as ENW and GWRL.

In FIG. 7, local read circuit 255 includes transistor M5 coupled to the power supply and transistor M3 coupled to the ground. M5 an M3 are couple to an enable read (ENR) 240 signal and its complement, respectively. As shown in FIG. 7, transistor M3 couples MBL 230 to a ground voltage, while transistor M5 couples MSL 220 to the power supply. The MBL line is also coupled to GWRL, and current ID1 flows in MBL through transistor M4 to transistor M1 of a current mirror. FIG. 7 also shows a global sense amplifier (SA), which is coupled to signal GREF and a current ID2 which flows through M2 of the current mirror.

Figure 8:
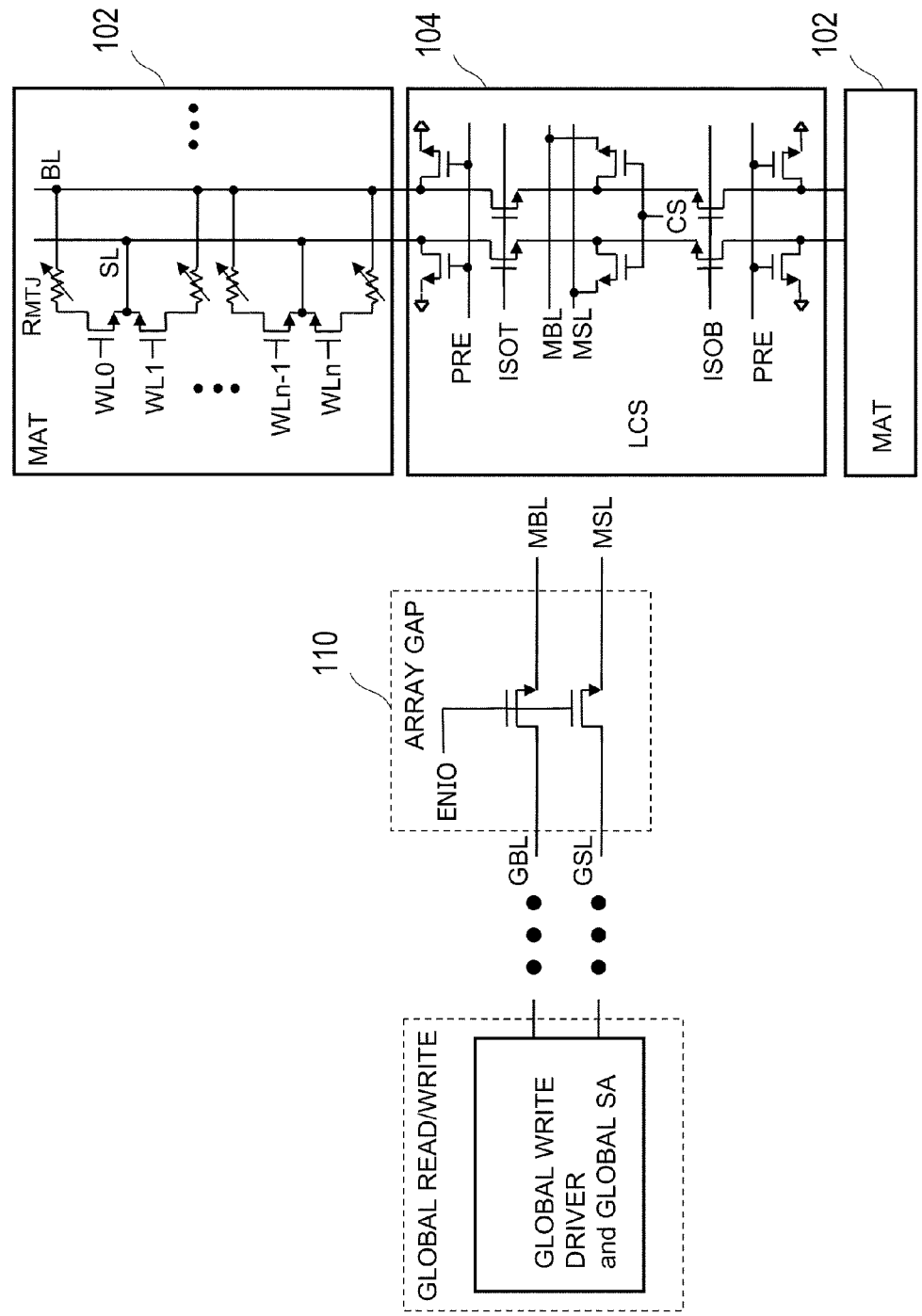
FIG. 8 is a schematic diagram of portions of an MRAM showing associated writing and reading circuitry, in accordance with an alternative embodiment of the present invention.

FIG. 8 is a schematic diagram of portions of an MRAM showing associated writing and reading circuitry, in accordance with an alternative embodiment of the present invention. FIG. 8 shows MAT 102, LCS 104, array gap 110, and a global SA, similar to those circuits described above in connection with FIG. 7. In this embodiment, the read and write circuitry are included in the Global Read/Write block, which is coupled to GBL and GSL signal lines. GBL and GSL, in turn, are coupled to MBL and MSL, respectively, through a pair of pass transistors under the control of signal ENIO in the array gap block.

Figure 9:
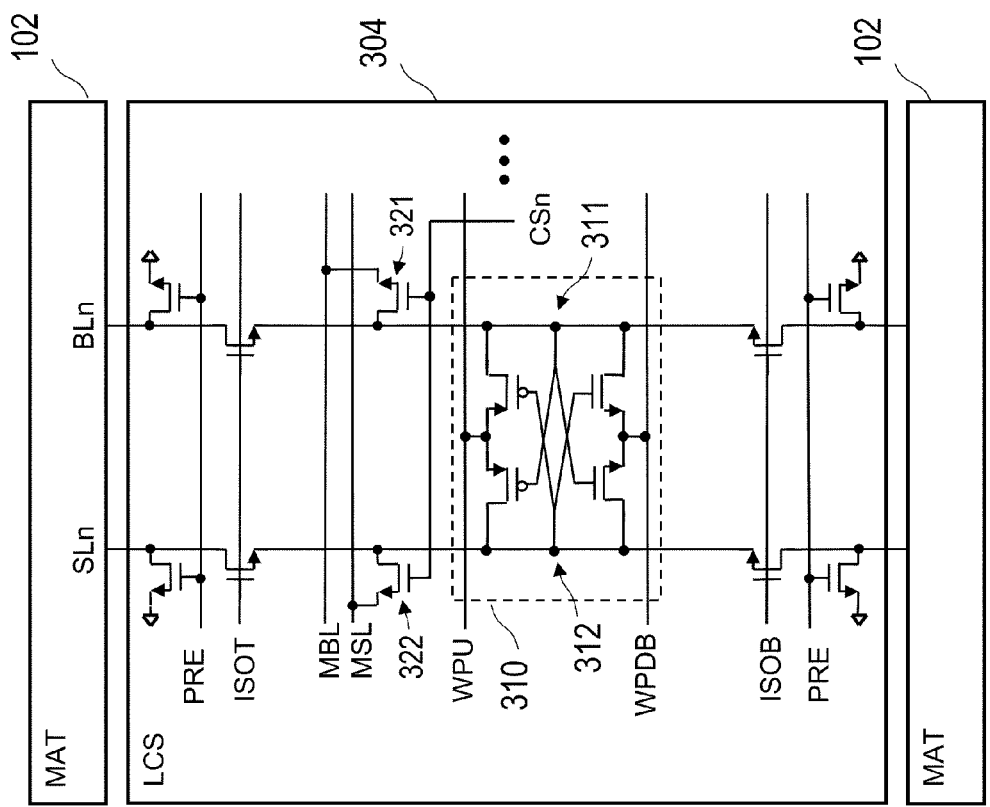
FIG. 9 is a schematic diagram of portions of an MRAM illustrating a writing circuitry, in accordance with one embodiment of the present invention.

FIG. 9 is a schematic diagram of portions of an MRAM illustrating a read/write circuitry, in accordance with one embodiment of the present invention. FIG. 9 illustrates one of the plurality of columns, including MAT 102 and LCS 304, which are similar to MAT 102 and LCS 104 in FIGS. 7 and 8. However, LCS 304 in FIG. 9 includes a bistable regenerative circuit 310 having a first terminal 311 coupled to a first signal line (BLn), a second terminal 312 coupled to a second signal line (SLn), a third terminal coupled to a third signal line (WPU), and a fourth terminal coupled to a fourth signal line (WPDB). In this specific embodiment, bistable regenerative circuit 310 includes cross-coupled CMOS transistors forming a latch. It is appreciated, however, that other bistable regenerative circuits can also be used.

In FIG. 9, MAT 102 includes non-volatile memory cells similar to the memory cells in FIGS. 7 and 8. In these embodiments, the non-volatile memory cell is an SST-RAM cell. Even though the embodiments are described herein using a memory cell whose memory state is determined by a change in a resistive property of the cell, it is understood that other memory cells can also be used. Such memory cells can include, for example, EEPROM, FLASH, FeRAM, PRAM, MRAM, and Resistive RAM (RRAM), etc. Further, embodiments of the invention can also be applied to memories with SPI (serial port interface), XDR (extreme data rate), LVDS (low voltage differential signaling), and SPMT (serial port memory technology), etc. In addition, embodiments of the invention can also be applied to other memory structures, for example, SRAM or DRAM, etc. As shown in FIGS. 7 and 8, each non-volatile memory cell in MAT 102 has a first current carrying terminal coupled to said first signal line (BLn), a second current carrying terminal coupled to said second signal line (SLn) and a control terminal coupled to one of said plurality of word-lines (WL).

LCS 304 in FIG. 9 also includes a first transistor 321 having a first current carrying terminal coupled to first terminal 311 of bistable regenerative circuit 310, and a second current carrying terminal coupled to a fifth signal line (MBL). LCS 304 also has a second transistor 322 having a first current carrying terminal coupled to second terminal 312 of bistable regenerative circuit 310 and a second current carrying terminal coupled to a sixth signal line (MSL). The gate terminals of transistors 321 and 322 are coupled to an nth signal line (CSn), which is a column select signal in this example.

In a specific embodiment, terminals 311 and 312 of bistable regenerative circuit 310 carry voltage signals that are logic complements of one another. Further, signals lines BLn and SLn carry voltage signals that are logic complements of one another. Signals lines WPU and WPDB carry voltage signals that are logic complements of one another. Moreover, signals lines MBL and MSL carry voltage signals that are logic complements of one another. Of course, other arrangement of the signal lines can also be used.

In this embodiment, the non-volatile memory cell is an STT-RAM (Spin Transfer Torque RAM) cell that includes a magnetic tunnel junction and a transistor coupled in series. The STT-RAM cell is coupled to two signal lines BL and SL. The magnetic tunnel junction has a first terminal coupled to one of the signal lines, and the transistor has a first current carrying terminal coupled to the first current carrying terminal of said non-volatile memory cell, a gate terminal coupled to the control terminal of the non-volatile memory cell, and a second current carrying terminal coupled to a second terminal of the magnetic tunnel junction.

In FIG. 9, signal lines WPU, WPDB, MBL, and MSL correspond to the plurality of columns. In an embodiment, signal lines WPU, WPDB are coupled to a control logic circuit, and signal lines MBL, and MSL are coupled to a write driver circuit and to a sensing circuit. The CSn signal line corresponds to one of the plurality of columns and is coupled to a column selection circuit.

In accordance with one embodiment of the present invention, the memory array described above also includes circuitry for carrying out the following operations:
Read data from the non-volatile memory cell;
Latch data from the non-volatile memory cell in the bistable regenerative circuit; and
Program the non-volatile memory cell using the data latched in the bistable regenerative circuit.

For example, the data read from the non-volatile memory cell can be held in register block 107 depicted in FIG. 6, and then latched into bistable regenerative circuit 310 in LCS 304 of FIG. 9.

In accordance with another embodiment of the present invention, the memory array described above also includes circuitry for carrying out the following operations:
Provide a first data to said one of the plurality of columns;
Read a second data from a second one of the plurality of columns;
Latch the first data and second data in respective bistable regenerative circuits in the one of plurality of columns and second one of the plurality of columns; and
Program non-volatile memory cells in the columns using the data latched in the bistable regenerative circuits.

In this embodiment, reading and programming (writing) of the non-volatile memory cells can be achieved using the read/write circuitry and various combinations of signal lines described above, and more details are provided below.

Figure 10:
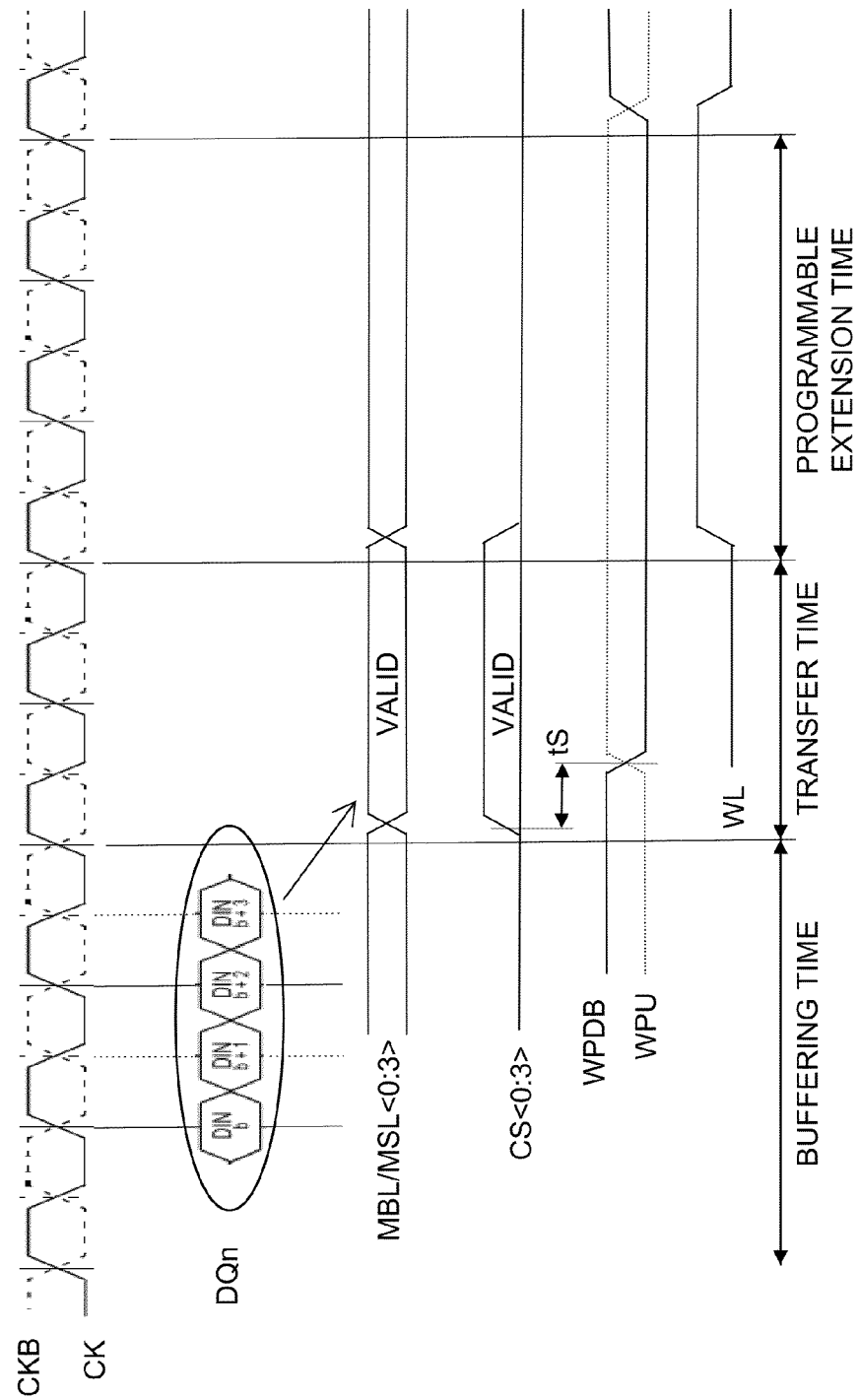
FIG. 10 is a timing diagram illustrating a writing operation of the circuitry of FIG. 9, in accordance with one embodiment of the present invention.

FIG. 10 is a timing diagram illustrating a writing operation of the circuitry of FIG. 9, in accordance with one embodiment of the present invention. More particularly, a write operation using four of the memory array bistable regenerative circuit 310 is described. During a write cycle, the write drivers (e.g., as shown in FIGS. 7 and 8) drive the MBL and MSL to the BL and SL of the selected column under control of various signal lines describe above. In an embodiment, bistable regenerative circuit 310 continues to drive the BL and SL even after the column select (CS) signal is de-activated.

In an embodiment of the read/write operation, the selected row and column addresses, WL and CS, respectively, are turned on, and the data on the select bit is read using the current mirror pre-amplifier circuit shown in FIG. 7. The data from the global sense amplifier (SA), not shown here, is simultaneously written back through global write drivers (next to global SA) repeated through local write driver shown in FIG. 7. At this time, WPU is activated to go high, and WPDB is activated to go low. This arrangement will latch the data even after the column address has changed and sustain the write operation until the WL goes inactive. To write opposite data into the selected bit, new data is transferred onto the write drivers, and the column address is turned on again. The local write driver, e.g., write circuit 250 in FIG. 7, will overcome the cross-coupled write sustain latch and flip the polarity on the BL and SL.

The timing diagram of FIG. 10 shows clock signals CK and CKB, data signals DQn (showing four DIN's), MBL/MSL, CS, WPDB, WPU, and WL. In one embodiment, during a buffering time, input data becomes available. FIG. 10 shows a double data rate (DDR) burst write cycle with burst length of 4. Data-in is registered on the positive and negative edges of the memory clock. Data-in is registered and held until the end of the Data-in burst. Once all four bits are registered, they are transferred simultaneously. Each bit is written into a corresponding latch, 310, selected by their respective column addresses (CS0, CS1, CS2, and CS3 in this example). In this architecture, four bits can be transferred at once through MSL0, MSL1, MSL2, MSL3 and MBL0, MBL1, MBL2, MBL3. During the transfer time, four data bits are provided on MBL[0:3] and MSL[0:3] lines, which carry voltage signals that are logic complements of one another. A plurality of columns are selected by the CS[0:3] signals. With WPU and WPDB activated, all four data bits are latched in their respective bi-stable regenerative circuit 310 of FIG. 9. Since WPU and WPDB are common to the entire memory array tile, columns that have not been activated will have arbitrary data latched in 310. In this architecture, the entire row with common WPU and WPDU will be written once valid data is written into 310. A column address counter can be used to generate the column address for the entire page (entire row). The user just needs to specify which memory array tile is to be written. The start address can be the least significant bit (LSB) of the page and increment automatically up the last column address of the page. When the latch (310) in the entire page contains valid data, the WL of that page is then activated to transfer the data of the entire page into their respective memory cells. The write time depends on the length of time the word line is active. Therefore, the write time is marked "extension time" in FIG. 10. The embodiment above shows a page size of 4. Theoretically, there is no limit to the page size. However, memory page sizes may vary, for example, from 8 to 8192. The number of MSL and MBL lines within a MAT may be limited, for example, to 4 to 8 pairs of lines. If the page size is greater than 8, then a burst of 4 or 8 can be done sequentially using the same 4 or 8 MSL and MBL lines. For example, for page size of 1024 with 4 pairs of MSL/MBL lines, 256 sequential 4-bit column burst is required to write the entire page.

Figure 11:
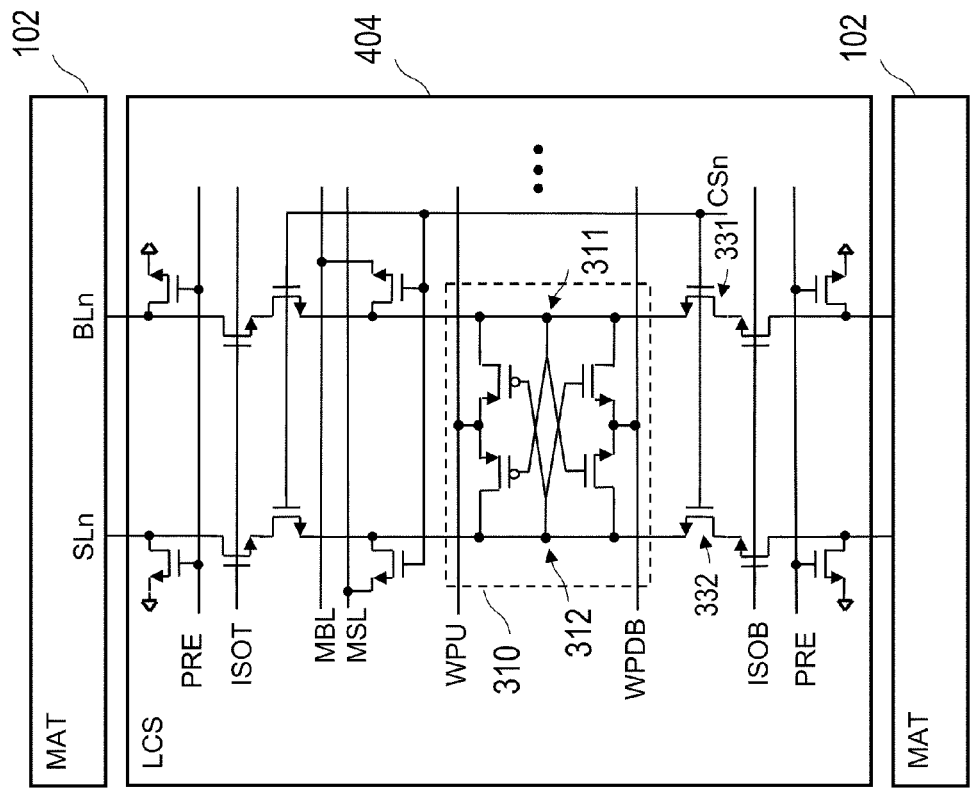
FIG. 11 is a schematic diagram of portions of an MRAM illustrating a page mode write circuitry, in accordance with one embodiment of the present invention.

FIG. 11 is a schematic diagram of portions of an MRAM illustrating a read/write circuitry, in accordance with one embodiment of the present invention. FIG. 11 illustrates one of the plurality of columns, including MAT 102 and LCS 404, which are similar to MAT 102 and LCS 304 in FIG. 9 and includes a bistable regenerative circuit 310. It is noted that LCS 404 in FIG. 11 also includes transistors 331 and 332. Transistor 331 is coupled between terminal 311 of bistable regenerative circuit 310 and signal line BLn. Transistor 332 is coupled between terminal 312 of bistable regenerative circuit 310 and signal line SLn. The gate terminals of transistors 331 and 332 are coupled to signal line CSn. As described above, signal line CSn is related to column select functions. The embodiment of FIG. 11 isolates bistable regenerative circuit 310 from both the top MAT and the bottom MAT under the control of the column select signal CSn. Transistors 331 and 332 allow for selective writing so that the entire page does not have to be written. Another embodiment is to use multiple WPU and WPDB lines to decode the columns. In the embodiment shown in FIG. 11, data can be written after the first burst is complete (see FIG. 14). In other embodiments, the bursts can be repeated to implement a page in many bursts. In an embodiment, a counter is used to automatically increment the write address for latching the data in bistable regenerative circuits 310 in different columns.

In accordance with an embodiment of the present invention, a method is provided for writing data in a memory device. Some examples of a non-volatile memory are described above. But the method is applicable to a volatile or a non-volatile memory device that includes a plurality of word-lines and memory cells arranged in a plurality of columns, each of the columns including a bistable regenerative circuit and isolation transistors that isolate the bistable regenerative circuit from at least part of memory cells in the column. The method includes the following steps:

receiving a first plurality of data with a starting column address;

latching the first plurality of data into bistable regenerative circuits in a corresponding first plurality of columns based on the starting column address; and simultaneously writing the latched data into memory cells in the corresponding first plurality of columns.

In a specific embodiment of the above method, the latching of the data is performed sequentially in an extended write time. In another embodiment, the first plurality of data includes N data bits, where N is a burst length. In another embodiment, the memory is configured to latch N data bits in a write cycle, and the latching step described above is repeated until all N data bits are latched in the corresponding N columns in an extended write time.

For example, in a 1 GHz operation, the column cycle time is typically 1 Ghz (1 ns). In an 8-bit burst write operation, eight bits of data are presented to the memory sequentially. With a start address provided to the memory by, e.g., the processor, seven subsequent column addresses can be generated from the start address. After all eight bits are registered or stored, they are then transferred at once into the local column bistable regenerative circuits (310) by activating the eight decoded column select lines and driving data through the eight MSL-MBL pairs. At this time, WPU and WPDB are driven to activate the bistable regenerative circuits (310). While MSL and MBL can drive the SL and BL through the CS line directly; the bistable regenerative circuit (310) will latch the data and continue driving SL and BL. The eight bits of data can then be written from the latches to eight columns at the same time. In this embodiment, a random column address can be provided to initiate the next burst cycle allowing for random back-to-back burst write. Here, the bistable regenerative circuit 310 can also act as a repeater or driver to provide more current drive if needed. Therefore, the bistable regenerative circuit 310 is also referred to as write-driver-latch 310.

In an embodiment, a page mode scheme is described above in connection with FIG. 9. For example, N bits of data at a time are latched to all the write-latch-drivers (310), at operating speed (e.g. one Ghz cycle). Then the entire page is written by activating the page (turning on the row) for the extended write time (e.g. WL high for 15 ns). This scheme writes the entire page, even if only one bit needs to be changed, in which case, the unchanged data can be read and latched before the write. This scheme has the advantage that there is no limit to the write extension time.

Figure 13:
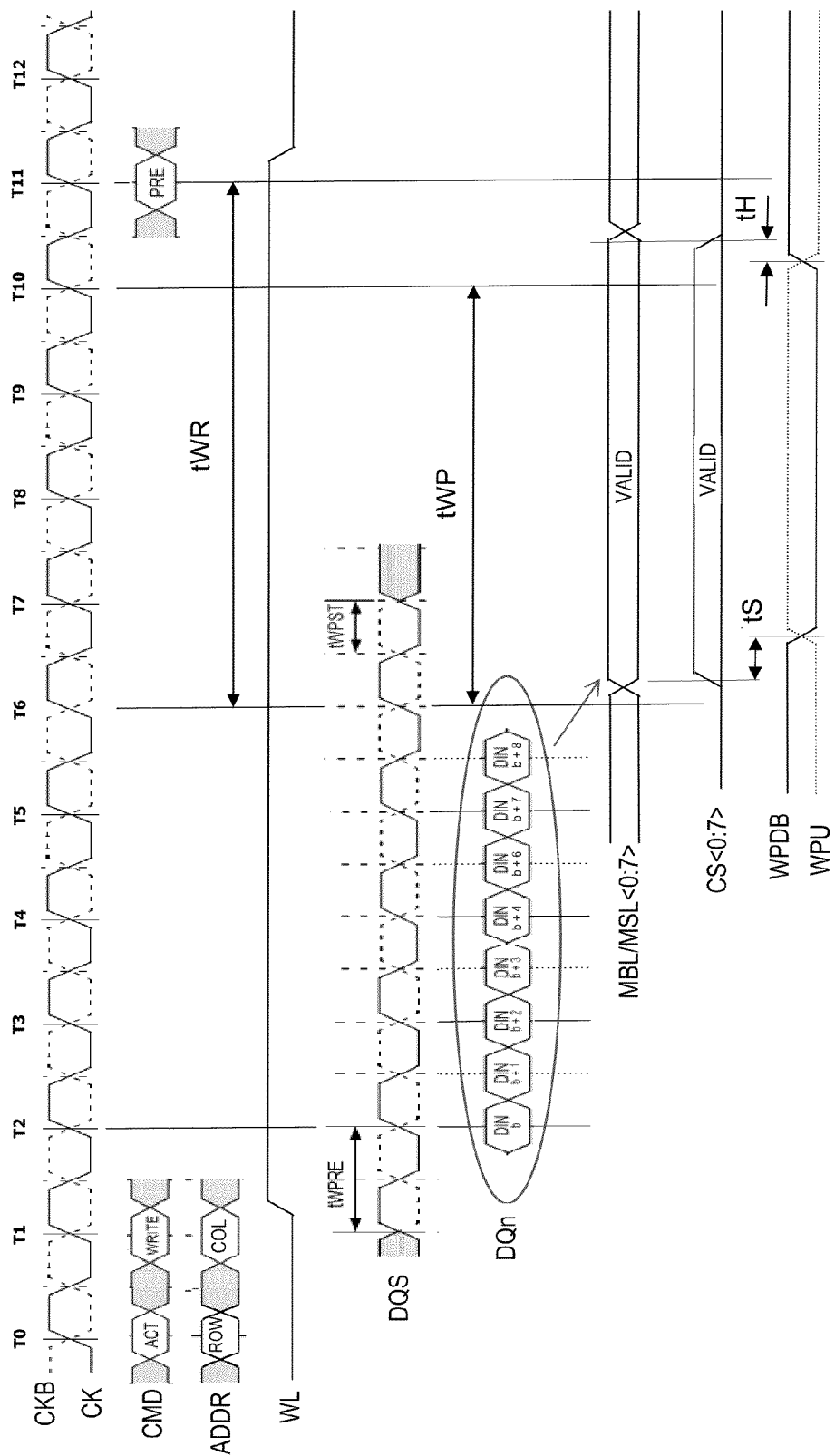
FIG. 13 is a timing diagram illustrating a DDR 8-bit burst mode write operation, in accordance with one embodiment of the present invention.
Figure 14:
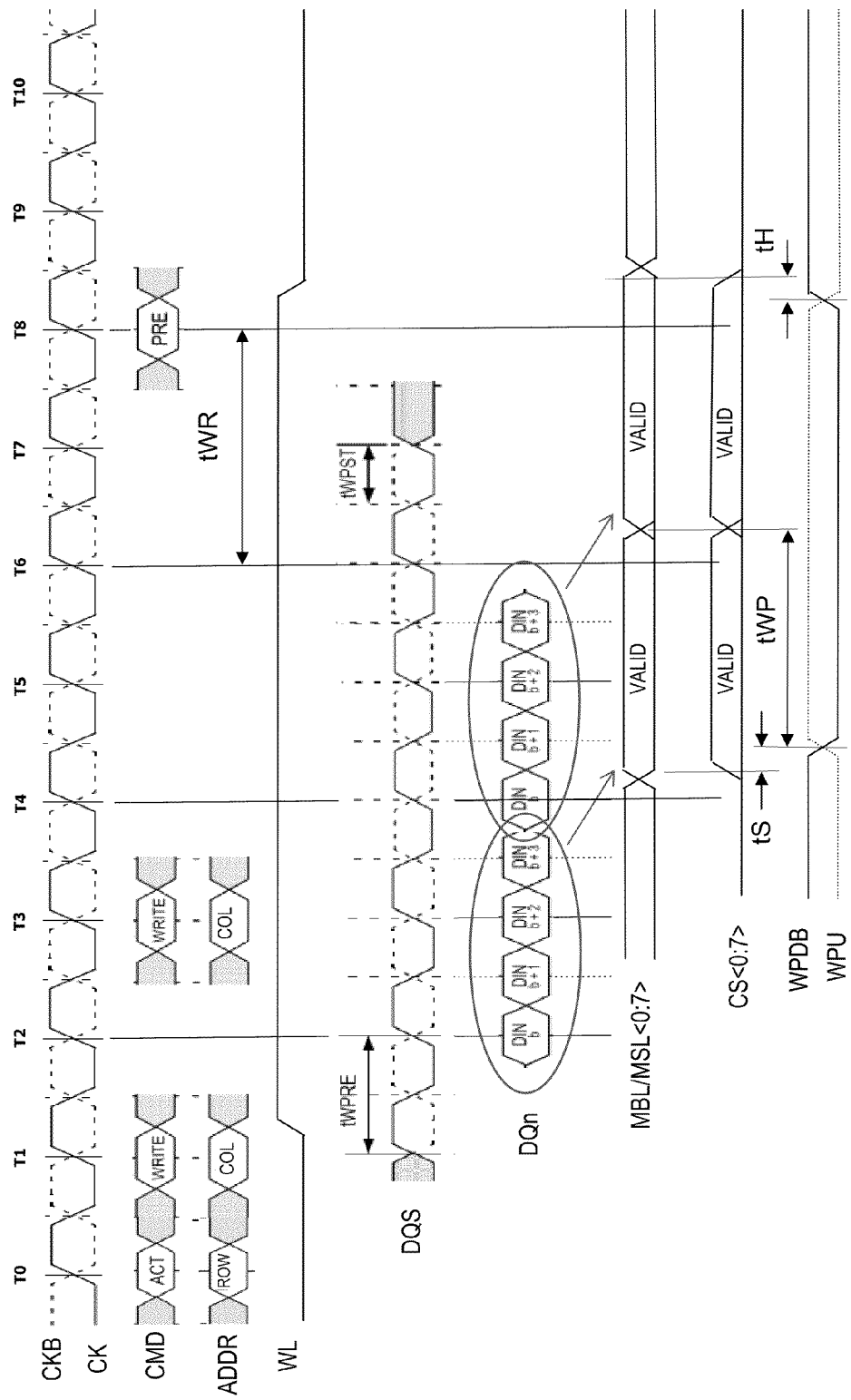
FIG. 14 is a timing diagram illustrating a DDR 4-bit burst mode write operation, in accordance with one embodiment of the present invention.

In another embodiment, a random burst write can be implemented using the circuit depicted in FIG. 11. Here, similar steps as those described above are used to latch and generate the data-in and address. However, the WL and WPU/WPDB can be turned on at the beginning of the write cycle (as illustrated in FIGS. 13 and 14 and discussed further below). In this case, the write time is only extended by the burst length time. This scheme can be used for random back to back burst write access. Note that this embodiment can also be used to implement page write.

Figure 12:
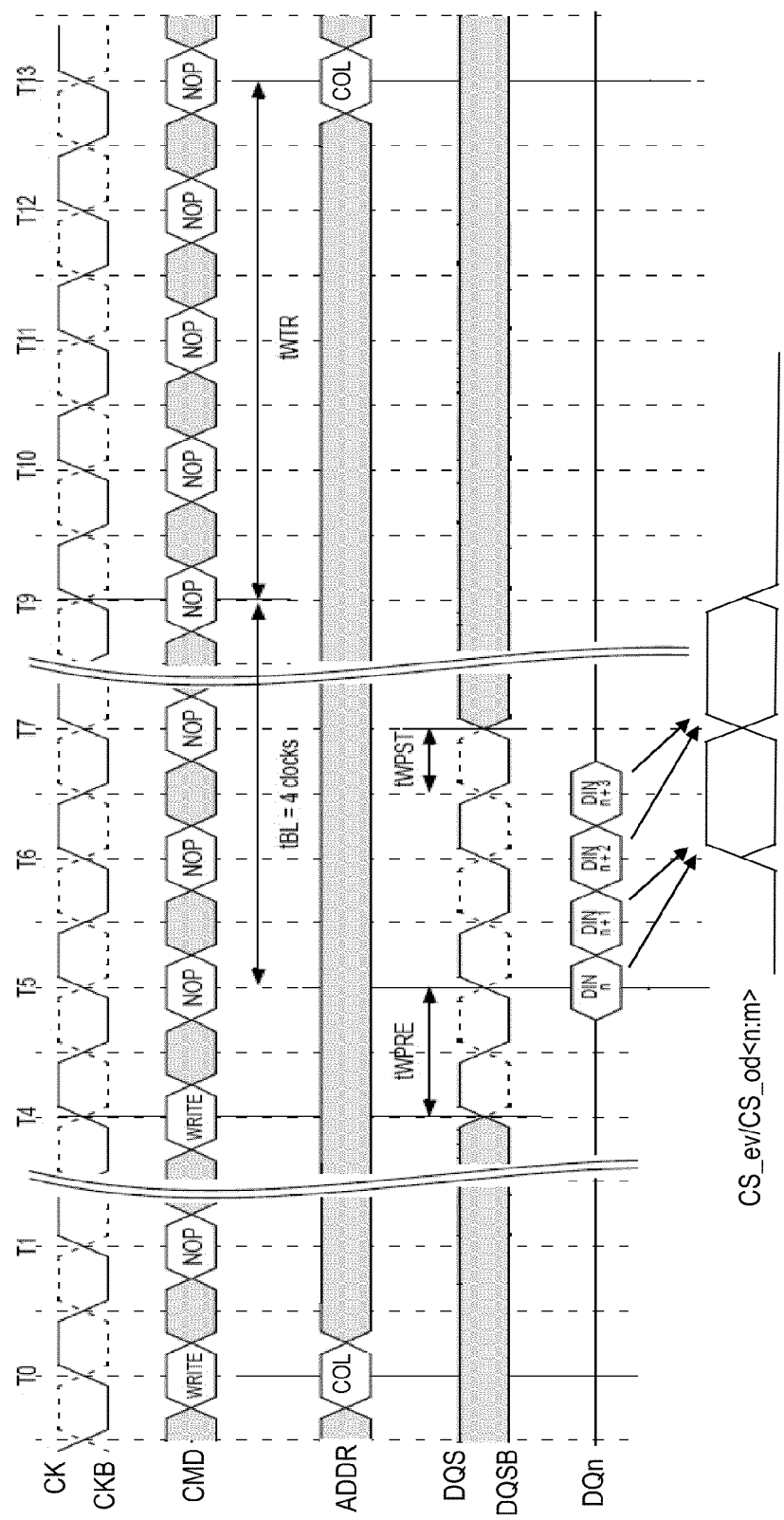
FIG. 12 is a timing diagram illustrating a write operation, in accordance with one embodiment of the present invention.

FIG. 12 is a timing diagram illustrating a write operation, in accordance with one embodiment of the present invention. In embodiments of the present invention, the non-volatile memory array and methods can be used to emulate a conventional DRAM. The timing signals in FIG. 12 include clock signals CK and CKB, command signal CMD, address signal ADDR, data signals DQS and DQSB for a conventional DRAM. FIG. 12 also shows data signal DQn and even and odd column address signals CS_ev and CS_od for operations of the non-volatile memory arrays described above. It is noted that the write operation at time T4 is followed by a delay time before the next pre-charge cycle, tWPRE.

FIG. 13 is a timing diagram illustrating a DDR 8-bit burst mode write operation using a non-volatile memory, in accordance with one embodiment of the present invention. FIG. 13 includes signals CK, CKB, CMD, ADDR, and DQS as described above with reference to FIG. 12 for the operation of a conventional DRAM. FIG. 13 also includes signals WL, DQn, MBL/MSL, CS, WPDB, and WPU as described above in connection with FIG. 10 for the operation of the non-volatile memory in accordance to embodiments of the present invention.

In an embodiment of using the non-volatile memory described above in an 8-bit DDR burst access, the decoded WL can be activated before or at the same time as the CS signals. The 8-bit column address can be predetermined by knowing the start burst address and the burst sequence (such as linear or interleave). Even and Odd column address (CS_ev, CS_od) are clocked on the positive edge at the same time. The start address will determine whether the even address or the odd address is processed first. In the case of an 8-bit read burst access, eight global sense amplifiers (SA) will read the 8-bit data at the same time. The 8-bit pre-fetched data is sent to Data Out registers and clocked out sequentially from the data out buffers. Read latency will be required at higher clock speeds. In the case of an 8-bit write access, the WL and CS signals are decoded and activated in the same fashion as the read cycle. In an embodiment, Data-in registers or a FIFO can be used to buffer the input data.

FIG. 14 is a timing diagram illustrating a burst mode write operation, in accordance with another embodiment of the present invention. It can be seen that FIG. 14 is similar to FIG. 13, except the eight bits of DQn are now grouped in two 4-bit groups.

Figure 15:
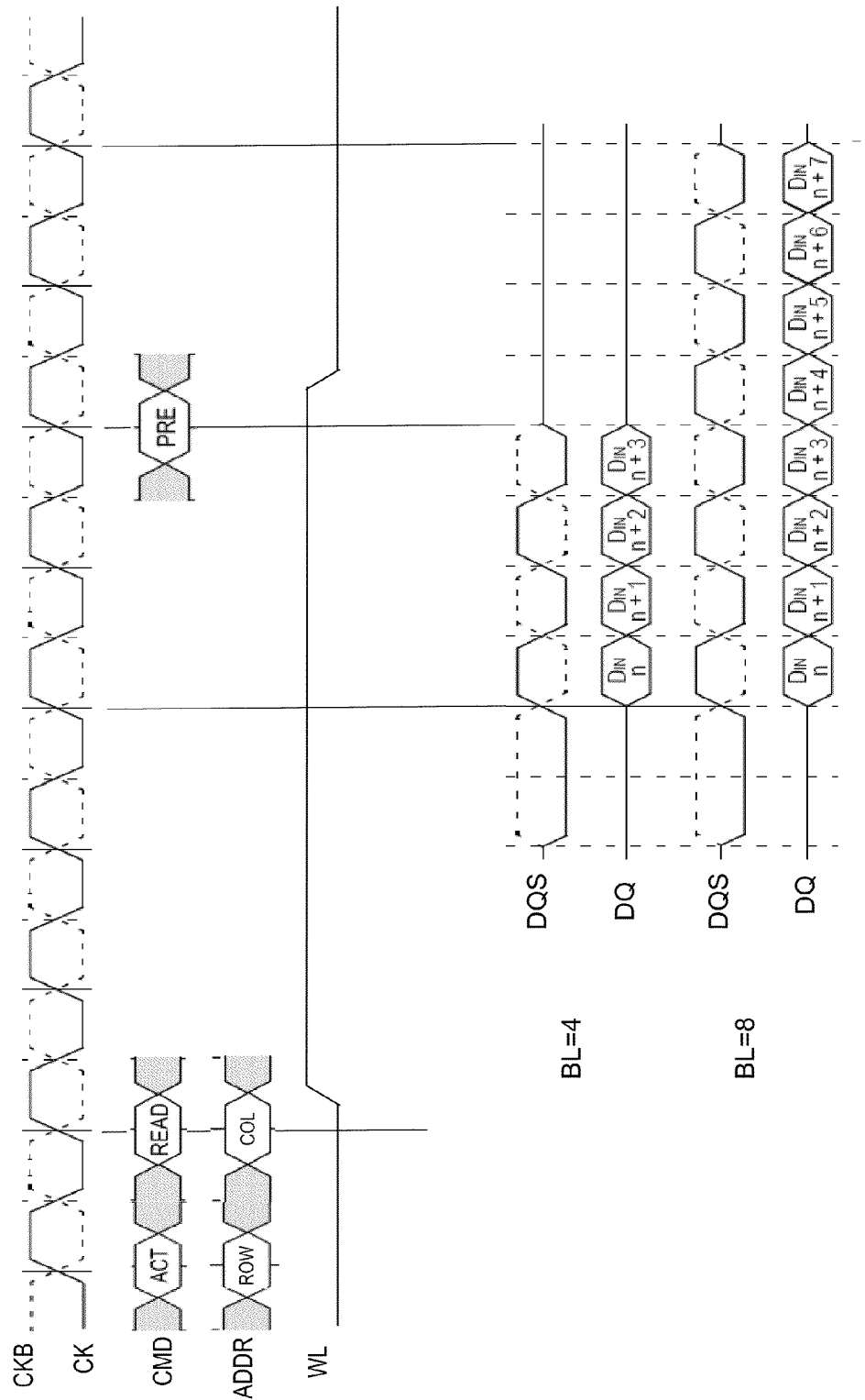
FIG. 15 is a timing diagram illustrating a DDR 4-bit/8-bit burst mode read operation, in accordance with one embodiment of the present invention.

FIG. 15 is a timing diagram illustrating a DDR 4-bit/8-bit burst mode read operation, in accordance with yet another embodiment of the present invention. Here, the data are shown for the burst length (BL) of 4 and BL of 8, respectively.

The above embodiments of the present invention are illustrative and not limitative. Various alternatives and equivalents are possible. The embodiments of the present invention are not limited by the type or the number of the magnetic random access memory cells used in a memory array. The embodiments of the present invention are not limited by the number of layers used to form a magnetic tunnel junction. The embodiments of the present invention are not limited by the voltage levels applied to the magnetic memory cells. Nor are the embodiments of the present invention limited by the NVM circuits being used to read and store complementary data found on a volatile storage element of the same selected memory cell during restore operation. The embodiments of the present invention are not limited by the type of transistor, PMOS, NMOS or otherwise, used to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. The embodiments described herein have been directed to MRAM memory reading and writing circuits but are not limited thereto. The embodiments described herein may be used wherever a storing volatile data in nonvolatile form within the same cell may be found useful.

What is claimed is:

1. A non-volatile memory array comprising:
   a plurality of word-lines; and
   a plurality of columns;
   one of said plurality of columns further comprising:
      a bistable regenerative circuit having a first terminal coupled to a first signal line, a second terminal coupled to a second signal line, a third terminal coupled to a third signal line, and a fourth terminal coupled to a fourth signal line;
      a non-volatile memory cell having a first current carrying terminal coupled to said first signal line, a second current carrying terminal coupled to said second signal line and a control terminal coupled to one of said plurality of word-lines;
      a first transistor having a first current carrying terminal coupled to said first terminal of said bistable regenerative circuit, and a second current carrying terminal coupled to a fifth signal line; and,
      a second transistor having a first current carrying terminal coupled to said second terminal of said bistable regenerative circuit, and a second current carrying terminal coupled to a sixth signal line;
      wherein gate terminals of said first and second transistors are coupled to a seventh signal line.

2. The non-volatile memory array of claim 1 wherein:
   said first and second terminals of said bistable regenerative circuit carry voltage signals that are logic complements of one another,
   said first and second signals lines carry voltage signals that are logic complements of one another,
   said third and fourth signals lines carry voltage signals that are logic complements of one another, and
   said fifth and sixth signals lines carry voltage signals that are logic complements of one another.

3. The non-volatile memory array of claim 1 wherein said bistable regenerative circuit comprises a latch.

4. The non-volatile memory array of claim 1 wherein said non-volatile memory cell is an EEPROM, FLASH, FeRAM, PRAM, MRAM, RRAM, or STT-MRAM cell.

5. The non-volatile memory array of claim 1 wherein said non-volatile memory cell further comprises:
   a magnetic tunnel junction having a first terminal coupled to said first signal line; and
   a third transistor having a first current carrying terminal coupled to said second current carrying terminal of said non-volatile memory cell, a gate terminal coupled to said control terminal of said non-volatile memory cell and a second current carrying terminal coupled to a second terminal of said magnetic tunnel junction.

6. The non-volatile memory array of claim 1 further comprising:
   a third transistor coupled between said first terminal of said bistable regenerative circuit and said first signal line; and
   a fourth transistor coupled between said second terminal of said bistable regenerative circuit and said second signal line;
   wherein gate terminals of said third and fourth transistors are coupled to said seventh signal line.

7. The non-volatile memory array of claim 1 wherein:
   said third, fourth, fifth and sixth signal lines correspond to said plurality of columns,
   said third and fourth signal lines are coupled to a control logic circuit,
   said fifth and sixth signal lines are coupled to a write driver circuit and to a sensing circuit, and said seventh signal line corresponds to one of said plurality of columns and is coupled to a column selection circuit.

8. The non-volatile memory array of claim 1 further comprising a circuit for:
reading data from the non-volatile memory cell;
latch said data from said non-volatile memory cell in the bistable regenerative circuit; and
programming said non-volatile memory cell using the data latched in said bistable regenerative circuit.

9. The non-volatile memory array of claim 1 further comprising a circuit for:
providing a first data to said one of said plurality of columns;
reading a second data from a second one of said plurality of columns;
latching said first data and second data in respective bistable regenerative circuits in said one of said plurality of columns and said second one of said plurality of columns; and
programming non-volatile memory cells in said columns using the data latched in said bistable regenerative circuits.

10. The non-volatile memory array of claim 1 further comprising a circuit for:
receiving a plurality of data bits;
selecting a corresponding plurality of columns;
latching each said plurality of data bits in a bistable regenerative circuit in one of the corresponding plurality of columns; and
simultaneously programming non-volatile memory cells in said plurality of columns using the data bits in the bistable regenerative circuits in the corresponding plurality of columns.

11. A method of forming a non-volatile memory array, the method comprising:
providing a plurality of word-lines;
providing a plurality of columns;
in one of said plurality of columns:
connecting a first terminal of a bistable regenerative circuit to a first signal line;
connecting a second terminal of said bistable regenerative circuit to a second signal line;
connecting a third terminal of said bistable regenerative circuit to a third signal line;
connecting a fourth terminal of said bistable regenerative circuit to a fourth signal line;
connecting a first current carrying terminal of a non-volatile memory cell to said first signal line;
connecting a second current carrying terminal of said non-volatile memory cell to said second signal line;
connecting a control terminal of said non-volatile memory cell to one of said plurality of word-lines;
connecting a first current carrying terminal of a first transistor to said first terminal of said bistable regenerative circuit;
connecting a second current carrying terminal of said first transistor to a fifth signal line;
connecting a first current carrying terminal of a second transistor to said second terminal of said bistable regenerative circuit;
connecting a second current carrying terminal of said second transistor to a sixth signal line; and
connecting gate terminals of said first and second transistors to a seventh signal line.

12. The method of claim 11 further comprising:
connecting a first terminal of a magnetic tunnel junction to said second signal line;
connecting a first current carrying terminal of a third transistor to said first current carrying terminal of said non-volatile memory cell;
connecting a gate terminal of said third transistor to said control terminal of said non-volatile memory cell; and
connecting a second current carrying terminal of said third transistor to a second terminal of said magnetic tunnel junction.

13. The method of claim 11 further comprising:
connecting said third and fourth signal lines to a control logic circuit;
connecting said fifth and sixth signal lines to a write driver circuit and to a sensing circuit; and
connecting said seventh signal line to a column selection circuit.

14. The method of claim 11 further comprising:
applying a first voltage to either said fifth or sixth signal lines;
applying a second voltage to said third signal line and to either said sixth or fifth signal lines, said second voltage being lower than said first voltage and said fifth and sixth signal lines carrying voltage signals that are logic complements of one another;
applying a third voltage to said seventh signal line, said third voltage being inclusively between a control voltage and a Vpp voltage, said Vpp voltage being higher than said first voltage and said control voltage enabling current flow in said first and second transistors;
applying a fourth voltage to said fourth signal line, said fourth voltage being inclusively between said first voltage and said Vpp voltage; and
applying said Vpp voltage to said control terminal of said non-volatile memory cell.

15. The method of claim 11 further comprising:
providing a first data bit on said fifth and sixth signal lines, said fifth and sixth signal lines carrying voltage signals that are logic complements of one another;
selecting the one of a plurality of columns;
latching said first data bit in said bistable regenerative circuit; and
programming said non-volatile memory cell using the first data bit in said bistable regenerative circuit.

16. The method of claim 11 wherein said non-volatile memory cell is an EEPROM, FLASH, FeRAM, PRAM, MRAM, RRAM, or STT-MRAM cell.

17. The method of claim 11 further comprising:
reading a first data from said non-volatile memory cell;
latching said first data in said bistable regenerative circuit; and
programming said first data in said non-volatile memory cell.

18. The method of claim 11 further comprising:
receiving a plurality of data bits;
selecting a corresponding plurality of columns;
latching each said plurality of data bits in a bistable regenerative circuit in one of the corresponding plurality of columns; and
simultaneously programming non-volatile memory cells in said plurality of columns using the data bits latched in the bistable regenerative circuits in the corresponding plurality of columns.

19. The method of claim 11 wherein the plurality of data bits comprises eight data bits.

20. The method of claim 11 wherein the plurality of data bits comprises four data bits.

21. The method of claim 11 further comprising:
providing a first data to a first column of said nonvolatile memory array;
reading a second data from a second column of said nonvolatile memory array;
latching said first data and said second data in bistable regenerative circuits in the corresponding columns; and
simultaneously programming non-volatile memory cells in said first and said second columns using data bits in the corresponding bistable regenerative circuits.

22. A method for writing data in a non-volatile memory that includes a plurality of word-lines and memory cells arranged in a plurality of columns, each of the columns including a bistable regenerative circuit and isolation transistors isolating the bistable regenerative circuit from at least part of the column, the method comprising:
receiving a first plurality of data with a starting column address;
latching the first plurality of data into bistable regenerative circuits in a corresponding first plurality of columns based on the starting column address; and
simultaneously writing the latched first plurality of data into a plurality of memory cells in the corresponding first plurality of columns.

23. The method of claim 22, wherein the latching of the data is performed sequentially in an extended write time.

24. The method of claim 22, wherein the first plurality of data comprises N data bits, where N is a burst length.

25. The method of claim 23, wherein the non-volatile memory is configured to latch N data bits in a write cycle, the method further comprising repeating the latching step until the N data bits are latched in the corresponding N columns.

* * * * *

UNITED STATES PATENT AND TRADEMARK OFFICE
CERTIFICATE OF CORRECTION

| | | |
|---|---|---|
| PATENT NO. | : 8,315,090 B2 | Page 1 of 1 |
| APPLICATION NO. | : 12/903152 | |
| DATED | : November 20, 2012 | |
| INVENTOR(S) | : Adrian E. Ong | |

It is certified that error appears in the above-identified patent and that said Letters Patent is hereby corrected as shown below:

In the Specification,

Column 1, line 20, please insert the following paragraph before the first paragraph:

--GOVERNMENT RIGHTS
This invention was made with U.S. Government support under Grant/Contract No. H R0011-09-C-0023 awarded by DARPA. The U.S. Government retains certain rights in this invention. Distribution authorized to U.S. Government Agencies only.--

Signed and Sealed this
Second Day of August, 2016

Michelle K. Lee
*Director of the United States Patent and Trademark Office*